(12) United States Patent
Li et al.

(10) Patent No.: US 7,153,708 B2
(45) Date of Patent: Dec. 26, 2006

(54) SEED LAYER PROCESSES FOR MOCVD OF FERROELECTRIC THIN FILMS ON HIGH-K GATE OXIDES

(75) Inventors: Tingkai Li, Vancouver, WA (US); Sheng Teng Hsu, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 11/249,883

(22) Filed: Oct. 12, 2005

(65) Prior Publication Data

US 2006/0035390 A1 Feb. 16, 2006

Related U.S. Application Data

(62) Division of application No. 10/453,831, filed on Jun. 2, 2003, now Pat. No. 7,008,801, which is a division of application No. 10/020,868, filed on Dec. 12, 2001, now Pat. No. 6,664,116.

(51) Int. Cl.
*H01L 21/00* (2006.01)

(52) U.S. Cl. .................... 438/3; 438/240; 438/785

(58) Field of Classification Search ............ 438/3, 438/240, 785
See application file for complete search history.

(56) References Cited

U.S. PATENT DOCUMENTS

| | | | |
|---|---|---|---|
| 6,190,925 B1* | 2/2001 | Li et al. ................. 438/3 |
| 6,229,166 B1* | 5/2001 | Kim et al. ............ 257/295 |
| 6,281,022 B1* | 8/2001 | Li et al. ................. 438/3 |
| 6,303,502 B1* | 10/2001 | Hsu et al. ............. 438/680 |
| 6,340,600 B1* | 1/2002 | Joo et al. ............... 438/3 |
| 6,372,034 B1* | 4/2002 | Zhuang et al. ...... 106/287.19 |
| 6,410,343 B1* | 6/2002 | Li et al. ................. 438/3 |
| 6,410,346 B1* | 6/2002 | Li et al. ................. 438/3 |
| 6,441,417 B1* | 8/2002 | Zhang et al. .......... 257/295 |
| 6,465,261 B1* | 10/2002 | Kang ..................... 438/3 |
| 6,475,813 B1* | 11/2002 | Li et al. ................. 438/3 |
| 6,483,137 B1* | 11/2002 | Li et al. ............... 257/295 |
| 6,495,378 B1* | 12/2002 | Li et al. ................. 438/3 |
| 6,503,314 B1* | 1/2003 | Li et al. ............. 106/287.19 |
| 6,503,763 B1* | 1/2003 | Li et al. ................. 438/3 |
| 6,531,324 B1* | 3/2003 | Hsu et al. ............... 438/3 |
| 6,537,361 B1* | 3/2003 | Zhuang et al. ...... 106/287.19 |
| 6,585,821 B1* | 7/2003 | Zhuang et al. ...... 106/287.19 |
| 6,590,243 B1* | 7/2003 | Li et al. ............... 257/295 |
| 6,602,720 B1* | 8/2003 | Hsu et al. ............... 438/3 |
| 6,616,857 B1* | 9/2003 | Li et al. ............. 252/62.9 R |
| 6,664,116 B1* | 12/2003 | Li et al. ................. 438/3 |
| 6,728,093 B1* | 4/2004 | Fox ..................... 361/303 |
| 6,737,693 B1* | 5/2004 | Li et al. ............... 257/295 |
| 6,794,198 B1* | 9/2004 | Li et al. ................. 438/3 |
| 6,825,519 B1* | 11/2004 | Li et al. ............... 257/306 |
| 6,855,974 B1* | 2/2005 | Matsuura et al. ...... 257/295 |
| 6,897,074 B1* | 5/2005 | Zhang et al. ........... 438/3 |
| 6,906,366 B1* | 6/2005 | Hsu et al. ............ 257/295 |
| 7,008,801 B1* | 3/2006 | Li et al. ................. 438/3 |

(Continued)

*Primary Examiner*—Laura M. Schillinger
(74) *Attorney, Agent, or Firm*—Robert D. Varitz, PC

(57) ABSTRACT

A method of forming a ferroelectric thin film on a high-k layer includes preparing a silicon substrate; forming a high-k layer on the substrate; depositing a seed layer of ferroelectric material at a relatively high temperature on the high-k layer; depositing a top layer of ferroelectric material on the seed layer at a relatively low temperature; and annealing the substrate, the high-k layer and the ferroelectric layers to form a ferroelectric thin film.

4 Claims, 3 Drawing Sheets

U.S. PATENT DOCUMENTS

| | | | |
|---|---|---|---|
| 7,009,231 B1 * | 3/2006 | Zhang et al. | 257/295 |
| 2002/0139955 A1 * | 10/2002 | Zhuang et al. | 252/62.9 PZ |
| 2002/0142487 A1 * | 10/2002 | Li et al. | 438/3 |
| 2002/0177244 A1 * | 11/2002 | Hsu et al. | 438/3 |
| 2003/0027360 A1 * | 2/2003 | Hsu et al. | 438/3 |
| 2003/0068848 A1 * | 4/2003 | Hsu et al. | 438/200 |
| 2003/0082909 A1 * | 5/2003 | Li et al. | 438/680 |
| 2003/0108670 A1 * | 6/2003 | Zhuang et al. | 427/240 |
| 2003/0109069 A1 * | 6/2003 | Li et al. | 438/3 |
| 2003/0205742 A1 * | 11/2003 | Hsu et al. | 257/295 |
| 2003/0207473 A1 * | 11/2003 | Li et al. | 438/3 |
| 2004/0188743 A1 * | 9/2004 | Li et al. | 257/306 |
| 2005/0069643 A1 * | 3/2005 | Li et al. | 427/248.1 |
| 2005/0178656 A1 * | 8/2005 | Li et al. | 204/192.29 |
| 2005/0196878 A1 * | 9/2005 | Zhang et al. | 438/3 |
| 2006/0035390 A1 * | 2/2006 | Li et al. | 438/3 |

* cited by examiner

SEED LAYER PROCESSES FOR MOCVD OF FERROELECTRIC THIN FILMS ON HIGH-K GATE OXIDES

RELATED APPLICATIONS

This application is related to U.S. patent application Ser. No. 10/015,817, filed on Oct. 30, 2001, for High k Gate Oxides with Buffer Layers of Ti for MFOS One Transistor Memory Applications; This Application is a division of patent application Ser. No. 10/453,831 filed Jun. 2, 2003 for Method of Forming Ferroelectric Thin Film on a High-K Layer, now U.S. Pat. No. 7,008,801, granted Mar. 7, 2006, which is a Division of U.S. patent application Ser. No. 10/020,868, filed Dec. 12, 2001, for Seed Layer for MOCVD Ferroelectric Thin Films on High-K Gate Oxides, now U.S. Pat. No. 6,664,116, granted Dec. 16, 2003.

FIELD OF THE INVENTION

This invention relates to ferroelectric thin film processes, ferroelectric memory device structures and integrated processes for ferroelectric non-volatile memory devices, and specifically to a method of fabricating a ferroelectric thin film formed on a high-k gate oxide.

BACKGROUND OF THE INVENTION

Metal, ferroelectrics, oxide, and silicon (MFOS) transistor ferroelectric memory devices have been proposed in the related applications. In order to provide a MFOS transistor memory device having desirable characteristics, the oxide must not react with nor diffuse into the ferroelectric and silicon substrate. On the other hand, ferroelectric thin films deposited on an oxide layer should have good ferroelectric properties for use in a memory transistor. Homogeneous ferroelectric thin films having desirable ferroelectric properties are difficult to deposit on gate oxides because of the interface mismatch between the high-k gate oxide and the ferroelectric materials. The mismatch results in random ferroelectric, such as PGO, thin films and coarser surface roughness. Seed layer processes have been developed for MFOS transistor ferroelectric memory applications to resolve the interface mismatch.

SUMMARY OF THE INVENTION

A method of forming a ferroelectric thin film on a high-k layer includes preparing a silicon substrate; forming a high-k layer on the substrate; depositing a seed layer of ferroelectric material at a relatively high temperature on the high-k layer; depositing a top layer of ferroelectric material on the seed layer at a relatively low temperature; and annealing the substrate, the high-k layer and the ferroelectric layers to form a ferroelectric thin film.

It is an object of the invention to provide a seed layer of FE material to enhance the FE deposition process.

A further object of the invention is to provide a FE device which is not degraded by an interface mismatch.

Another object of the invention is to provide a FE device using a seed layer processes to deposit homogeneous ferroelectric thin films on a high-k gate oxide, such as $ZrO_2$, $HfO_2$ and $(Zr_xHf_{1-x})O_2$, in a MFOS transistor ferroelectric memory application.

Another object of the invention is to provide a MFOS one transistor device.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Figure 1:
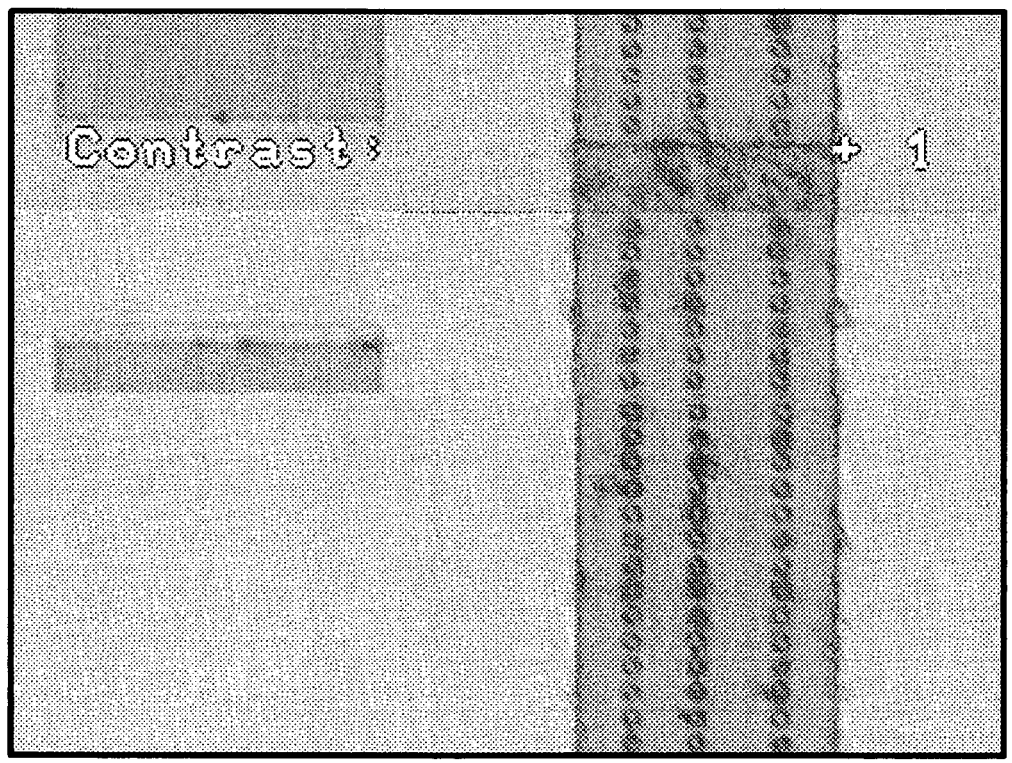
FIG. 1 depicts an as-deposited PGO thin film without a seed layer.

In order to explain the fabricate a ferroelectric layer on a high-k layer, a ferroelectric (FE) thin film metal-ferroelectric-oxide-silicon (MFOS) structure has been selected for incorporation into a one transistor memory device as an example of the method of the invention. To obtain adequate electrical properties in a MFOS transistor memory device, a seed layer is fabricated according to the method of the invention for a MFOS transistor ferroelectric memory application. A smooth ferroelectric lead germanium oxide ($Pb_5Ge_3O_{11}$) (PGO) thin films may be deposited on a high-k gate oxide, such as $ZrO_2$, $HfO_2$, or $(Zr_x, Hf_{1-x})O_2$, which PGO thin film has a low surface roughness and uniform thickness using the seed layer MOCVD method of the invention.

THE METHOD OF THE INVENTION

In the preferred embodiment of the method of the invention, a silicon wafer of the P type is used as a substrate of a MFOS one transistor memory cell. The silicon wafer is cleaned using SC1+SC2; where SC1 is a mixture of 5500 ml of deionized water, 1100 ml of $NH_4OH$ and 1100 ml of $H_2O_2$, and where SC2 is a mixture of 6000 ml of deionized water, 1000 ml of HCl and 1000 ml of $H_2O_2$. The surface oxide is removed by an HF dip etch. A layer of high-k material, such as $HfO_2$ and $(Zr_{0.5}, Hf_{0.5})O_2$ thin film, having a thickness of between about 3.5 nm to 15 nm are deposited on the silicon substrate, by sputtering in the preferred embodiment. The silicon wafer, with the $HfO_2$ and $(Zr_{0.5}, Hf_{0.5})O_2$ layers, are annealed at between about 500° C. to 550° C. in a pure oxygen atmosphere to achieve full oxidation. An oxide MOCVD reactor is used for the growth of a layer having a thickness of between about 200 nm to 300 nm of c-axis oriented $Pb_5Ge_3O_{11}$ (PGO) thin film on the $(Zr_{0.5}, Hf_{0.5})O_2$ layer. A top electrode of platinum, having a thickness of about 100 nm, is deposited by an electrical beam evaporation technique.

For the MOCVD deposition of FE material, [Pb(thd)$_2$] and [Ge(ETO)$_4$], where thd is $C_{11}H_{19}O_2$ and ETO is $OC_2H_5$, in a molar ratio of about 5.0:3 to 5.5:3, are dissolved in a mixed solvent of butyl ether or tetrahydrofuran, isopropanol and tetraglyme in the molar ratio of about 8:2:1 to form a precursor solution. The precursor solution has a concentration of about 0.1 M/L of PGO. The solution is injected into a vaporizer at temperature in the range of between about 180° C. to 240° C., by a pump at a flow rate of between about 0.05 ml/min to 0.20 ml/min, to form the precursor gases. The feed line is maintained at a temperature of between about 185° C. to 245° C.

A FE seed layer MOCVD and annealing process, in the preferred embodiment, includes deposition of a layer of c-axis oriented PGO thin film, deposited on the high-k $(Zr_{0.5}, Hf_{0.5})O_2$, as follows: the deposition temperatures is between about 500° C. to 540° C. and the pressure is between about 1 torr to 5 torr; the oxygen partial pressures is between about 20% to 30%; the vaporizer temperature is between about 180° C. to 200° C.; the solution delivery rates is between about 0.05 ml/min to 0.1 ml/min; and the deposition time is between about 5 minutes to 20 minutes.

The main body, or top FE layer, of PGO is deposited on the seed layer at a relatively lower temperature as follows: the deposition temperatures is between about 380° C. and 420° C. and the pressure is between about 5 torr to 10 torr; the oxygen partial pressure is between about 30% to 40%; the vaporizer temperature is between about 200° C. to 240° C.; the solution delivery rate is between about 0.1 ml/min to 0.2 ml/min; and the deposition time is between about one hour to three hours, depending on the desired film thickness.

The post-deposition annealing temperature is between about 520° C. to 560° C. for between about thirty minutes and one hour in a pure oxygen atmosphere. The phases of the films are identified using x-ray diffraction. The capacitance of the PGO MFOS capacitors is measured using a Keithley 182 CV analyzer.

Results

Figure 2:
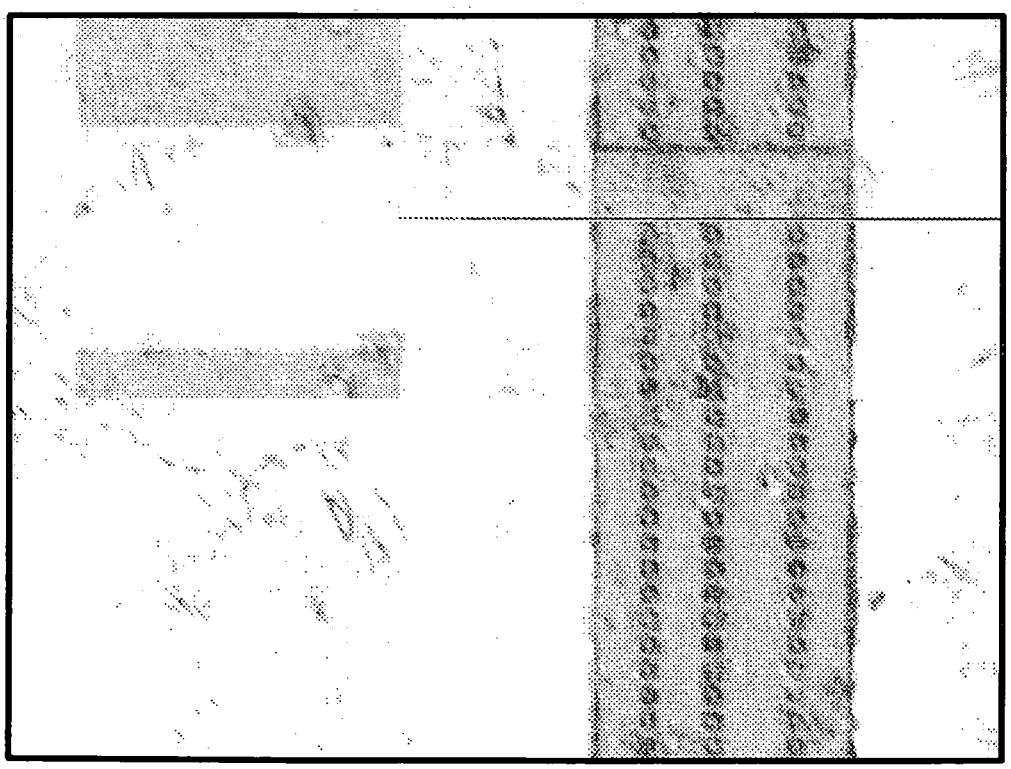
FIG. 2 depicts the PGO thin film of FIG. 1 after annealing.

In order to form a smooth PGO thin film having low surface roughness and containing relatively smaller particles, a PGO thin film must be deposited at a relatively lower deposition temperature, and then annealed at a relatively higher temperature to promote uniform grain growth. Experimental results demonstrate that smooth, amorphous PGO thin films became very rough following a high temperature anneal, as shown by the SEM photos of FIGS. 1 and 2. The reason for the rough surface is that there are not enough crystal nuclei in the PGO thin film deposited at the lower temperature to promote uniform grain growth, which results in a high surface roughness.

Figure 3:
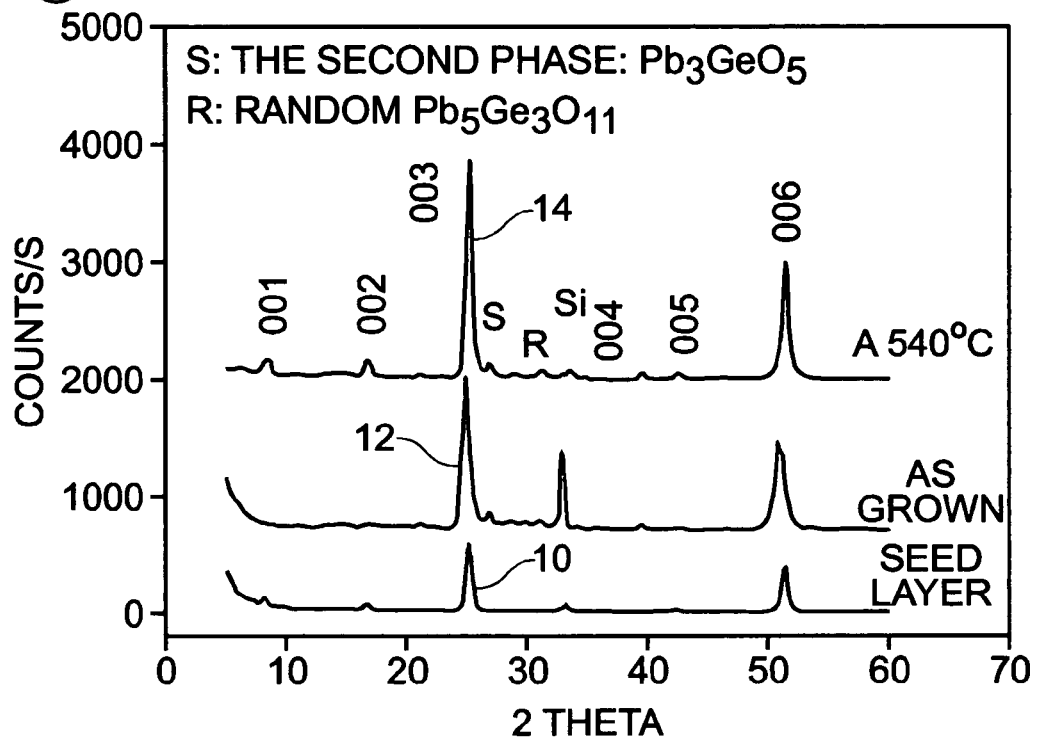
FIG. 3 depicts X-ray patterns of a PGO seed layer, and of PGO thin film as-grown and after annealing.

The seed layer MOCVD process of the method of the invention was developed to solve this problem. A PGO seed layer is deposited at a relatively high temperature and at a relatively low deposition pressure. The consequential low deposition rate and relatively low oxygen partial pressure avoid any gas phase reaction, which may result in the formation of undesirable particles. Formation of a homogeneous and continuous c-axis oriented PGO seed layer is required for the subsequent thin film growing steps. FIG. 3 depicts the x-ray pattern of a PGO seed layer, generally at 10, demonstrating the presence of a single-phase c-axis PGO seed layer.

The next step in the method of the invention is to grow an amorphous PGO thin film on the seed layer at a relatively low deposition temperature, and to then anneal the PGO thin film at a relatively high temperature to make the PGO thin film fully crystallize. Because the PGO seed layer provides homogeneous crystal nuclei for PGO grain growth during the annealing process, a smooth and fully crystallized PGO thin film is formed. FIG. 3 also depicts the x-ray patterns of PGO thin films as-grown 12 and after annealing 14.

Figure 4:
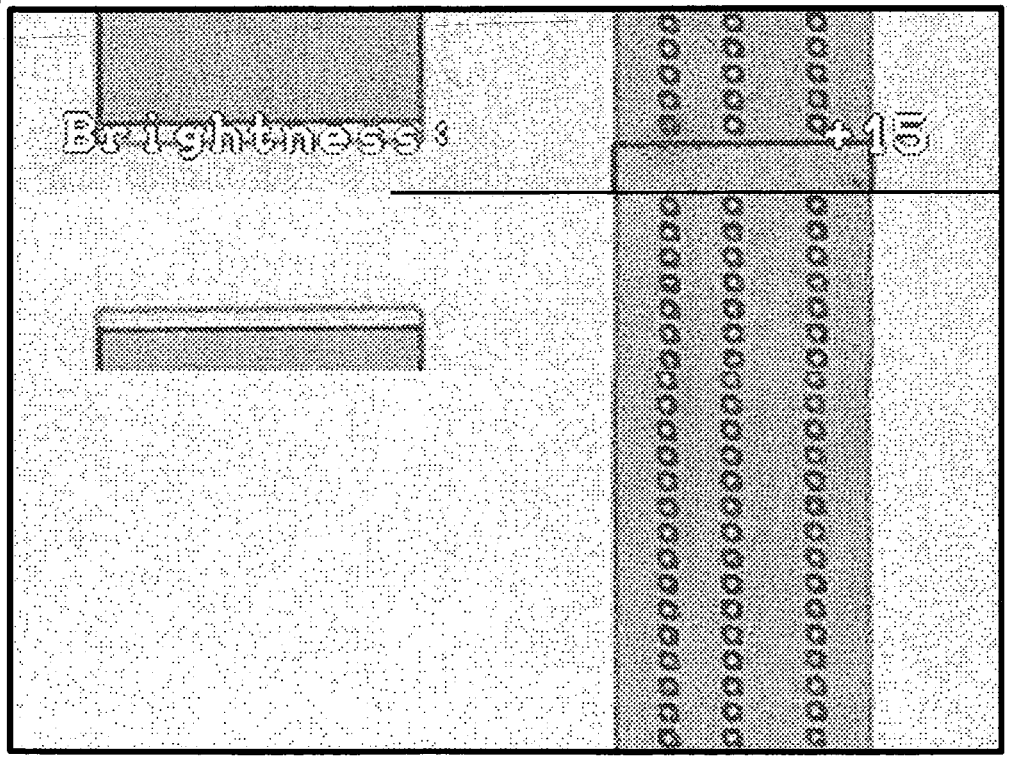
FIG. 4 depicts an as-grown PGO thin film deposited on a high-k layer with a seed layer.
Figure 5:
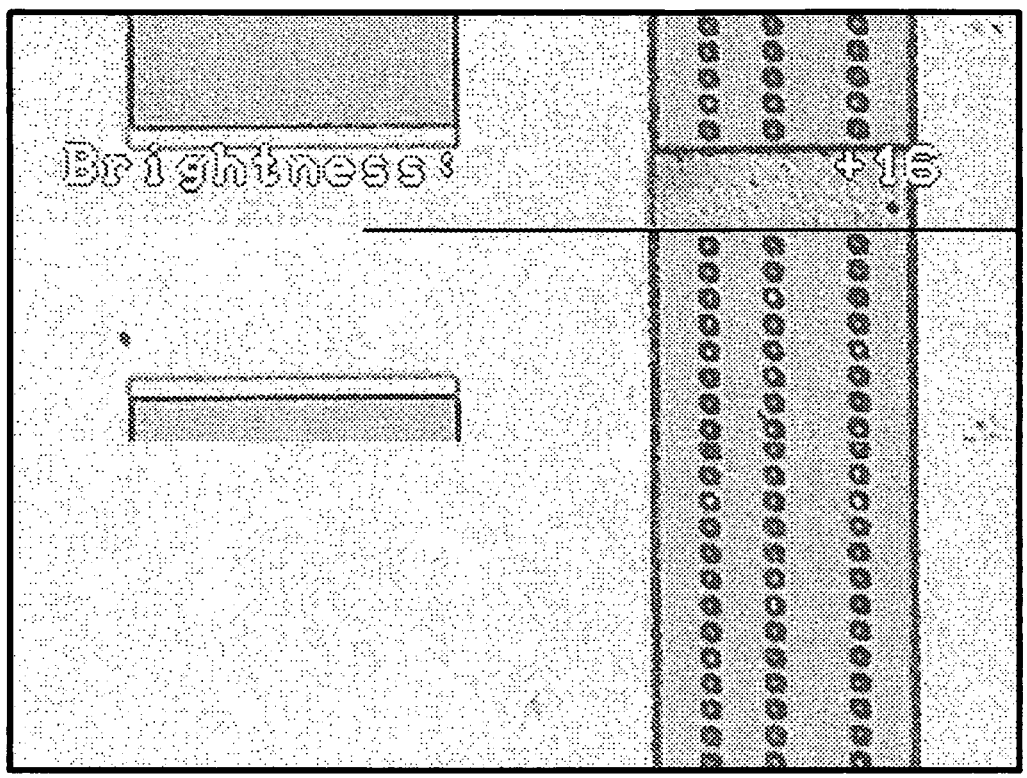
FIG. 5 depicts the PGO thin film of FIG. 4 after annealing.

FIG. 4 is a SEM photo of an as-grown PGO thin film on $(Zr_x, Hf_{1-x})O_2$, while FIG. 5 is a SEM photo of the PGO thin film after annealing. As-grown PGO thin films are very smooth and have very low surface roughness. After annealing at about 540° C., the grain size of the PGO thin film formed according to the method of the invention increases, but the PGO thin film is still smooth, and the annealing has almost no affect on the surface roughness of the thin film.

Figure 6:
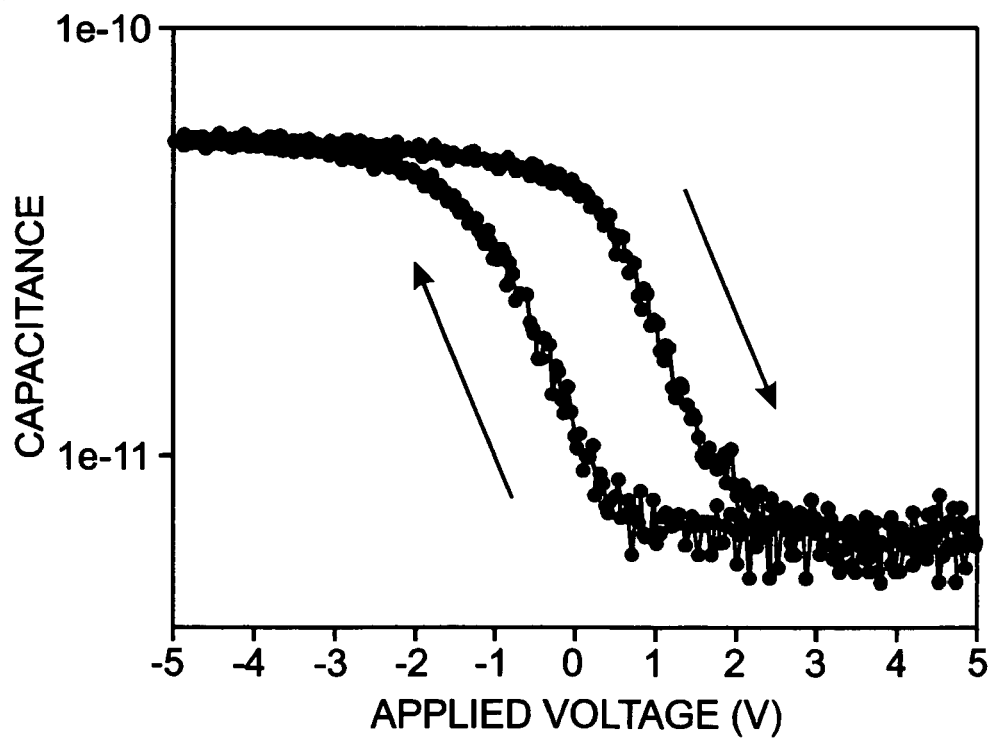
FIG. 6 depicts a C-V curve of a PGO MFOS capacitor constructed according to the method of the invention.

Platinum top electrodes are deposited on the PGO thin films made by the seed layer MOCVD process of the method of the invention to form a MFOS capacitor. FIG. 6 depicts the C-V curve of a PGO MFOS capacitor formed according to the seed layer MOCVD process of the method of the invention. The memory window of 1.5 V to 2.0 V is easily measured. A homogeneous ferroelectric thin films may be deposited on a high-k gate oxide while maintaining excellent ferroelectric properties according to the seed layer method of the invention. The seed layer may be deposited by MOCVD, sputtering, MOD, and sol-gel etc. methods. A homogeneous and smooth PGO thin film, having low surface roughness and uniform thickness may be deposited on a $(Zr_x, Hf_{1-x})O_2$ layer using the seed layer MOCVD process method of the invention. The memory windows of PGO MFOS capacitors are measured in a range of about 1.5 V–2.0 V.

Thus, a seed layer processes for MOCVD ferroelectric thin films deposited on high-k gate oxides has been disclosed. It will be appreciated that further variations and modifications thereof may be made within the scope of the invention as defined in the appended claims.

We claim:

1. A method of forming a ferroelectric thin film on a high-k layer, comprising:
   preparing a silicon substrate;
   forming a high-k layer on the substrate and annealing the high-k layer to form an oxide layer;
   preparing a PGO precursor solution;
   depositing a seed layer of ferroelectric material on the high-k oxide layer, wherein said depositing a seed layer includes depositing a layer of c-axis oriented PGO thin film at a temperatures of between about 500° C. to 540° C., at a pressure of between about 1 torr to 5 torr, in an atmosphere having an oxygen partial pressures of between about 20% to 30%, at a vaporizer temperature of between about 180° C. to 200° C.; wherein the precursor solution has a delivery rate of between about 0.05 ml/min to 0.1 ml/min, for a deposition time of between about 5 minutes to 20 minutes;
   depositing a top layer of ferroelectric material on the seed layer at a relatively low temperature, wherein said depositing a top ferroelectric layer includes depositing a PGO thin film at a deposition temperatures of between about 380° C. and 420° C., wherein the deposition pressure is between about 5 torr to 10 torr, in an atmosphere having an oxygen partial pressure of between about 30% to 40%, at a vaporizer temperature of between about 200° C. to 240° C., wherein the precursor solution delivery rate is between about 0.1 ml/min to 0.2 ml/min; and wherein the deposition time is between about one hour to three hours; and
   annealing the substrate, the high-k layer and the ferroelectric layers to form a ferroelectric thin film, wherein said annealing includes annealing at a temperature of between about 520° C. to 560° C. for between about thirty minutes and one hour in a pure oxygen atmosphere.

2. The method of claim 1 wherein said preparing a ferroelectric precursor solution for deposition by MOCVD, includes preparing a solution of [Pb(thd)$_2$] and [Ge(ETO)$_4$], where thd is $C_{11}H_{19}O_2$ and ETO is $OC_2H_5$, in a molar ratio of about 5.0:3 to 5.5:3, are dissolved in a mixed solvent, consisting of solvents taken from the group of solvents consisting of butyl ether, and tetrahydrofuran, isopropanol and tetraglyme, in the molar ratio of about 8:2:1, wherein the solution has a concentration of about 0.1 M/L of PGO, and wherein the solution is injected into a vaporizer at temperature in the range of between about 180° C. to 240° C., by a pump at a flow rate of between about 0.05 ml/min to 0.20 ml/min, to form the precursor gas, and wherein a MOCVD feed line is maintained at a temperature of between about 185° C. to 245° C.

3. The method of claim 1 wherein said forming a high-k layer includes forming a layer of material taken from the group of material consisting of $HfO_2$ and $(Zr_{0.5}, Hf_{0.5})O_2$, to a thickness of between about 3.5 nm to 15 nm.

4. The method of claim 1 wherein said preparing the silicon substrate includes cleaning the substrate using SC1+SC2; where SC1 is a mixture of 5500 ml of deionized water, 1100 ml of $NH_4OH$ and 1 100 ml of $H_2O_2$, and where SC2 is a mixture of 6000 ml of deionized water, 1000 ml of HCl and 1000 ml of $H_2O_2$; and which further includes removing any surface oxide by an HF dip etch.

* * * * *